(12) United States Patent
Pileggi et al.

(10) Patent No.: US 7,906,254 B2
(45) Date of Patent: Mar. 15, 2011

(54) METHOD AND PROCESS FOR DESIGN OF INTEGRATED CIRCUITS USING REGULAR GEOMETRY PATTERNS TO OBTAIN GEOMETRICALLY CONSISTENT COMPONENT FEATURES

(75) Inventors: Lawrence T. Pileggi, Pittsburgh, PA (US); Andrzej J. Strojwas, Pittsburgh, PA (US); Lucio L. Lanza, Palo Alto, CA (US)

(73) Assignee: PDF Solutions, Inc., San Jose, CA (US)

( * ) Notice: Subject to any disclaimer, the term of this patent is extended or adjusted under 35 U.S.C. 154(b) by 537 days.

(21) Appl. No.: 11/906,736

(22) Filed: Oct. 2, 2007

(65) Prior Publication Data
US 2008/0098334 A1   Apr. 24, 2008

Related U.S. Application Data

(62) Division of application No. 11/267,569, filed on Nov. 4, 2005, now Pat. No. 7,278,118.

(60) Provisional application No. 60/625,342, filed on Nov. 4, 2004.

(51) Int. Cl.
*G06F 17/50*  (2006.01)
*G06F 19/00*  (2006.01)
*G03F 1/00*   (2006.01)

(52) U.S. Cl. ............... 430/5; 716/50; 716/100; 700/121

(58) Field of Classification Search .......... 716/1, 19–21; 700/121; 430/4, 5; 382/141
See application file for complete search history.

(56) References Cited

U.S. PATENT DOCUMENTS

| | | | |
|---|---|---|---|
| 4,931,946 A | | 6/1990 | Ravindera et al. |
| 5,625,797 A | * | 4/1997 | Ferry et al. ............. 711/214 |
| 6,401,230 B1 | | 6/2002 | Ahanessians et al. |
| 6,493,855 B1 | | 12/2002 | Weiss et al. |
| 7,069,523 B2 | | 6/2006 | Nation et al. |
| 2004/0117744 A1 | | 6/2004 | Nation et al. |
| 2004/0128641 A1 | * | 7/2004 | Broberg et al. ............ 716/18 |
| 2005/0097499 A1 | | 5/2005 | Sun et al. |
| 2009/0244988 A1 | * | 10/2009 | Ashizawa ............ 365/189.05 |

* cited by examiner

*Primary Examiner* — Stacy A Whitmore
*Assistant Examiner* — Magid Y Dimyan
(74) *Attorney, Agent, or Firm* — Pillsbury Winthrop Shaw Pittman LLP

(57) ABSTRACT

The invention provides a method and process for designing an integrated circuit based on using the results from both 1) a specific set of silicon test structure characterizations and 2) the decomposition of logic into combinations of simple logic primitives, from which a set of logic bricks are derived that can be assembled for a manufacturable-by-construction design. This implementation of logic is compatible with the lithography settings that are used for implementation of the memory blocks and other components on the integrated circuit, particularly by implementing geometrically consistent component features. The invention provides the ability to recompile a design comprised of logic and memory blocks onto a new geometry fabric to implement a set of technology-specific design changes, without requiring a complete redesign of the entire integrated circuit.

13 Claims, 4 Drawing Sheets

METHOD AND PROCESS FOR DESIGN OF INTEGRATED CIRCUITS USING REGULAR GEOMETRY PATTERNS TO OBTAIN GEOMETRICALLY CONSISTENT COMPONENT FEATURES

RELATED APPLICATIONS

This is a Divisional Application of, and claims benefit to U.S. patent application Ser. No. 11/267,569, filed Nov. 4, 2005 now U.S. Pat. No. 7,278,118, which is hereby incorporated herein by reference in its entirety and which claims priority to U.S. Provisional Application No. 60/625,342 entitled "A Method and Process for Design of Integrated Circuits Using Regular Geometry Patterns" filed on Nov. 4, 2004.

BACKGROUND

1. Field of Invention

The present invention relates to a method and process for design of integrated circuits using regular geometry patterns to obtain component features that are geometrically consistent and, more particularly to the design of integrated circuits that have memory cells and logic components using regular geometry patterns to obtain geometrically consistent component features.

2. Background of the Invention

The active devices (transistors) and metal interconnecting layers for an integrated circuit (IC) are typically created by printing geometrical shapes onto a mask, then using a lithography process to translate said shapes onto layers of materials that define the shapes for the corresponding fabrication steps. Upon completion of multiple stages of said steps, including the layering of materials, three dimensional devices and interconnecting layers are ultimately produced to form the integrated circuit. As feature sizes are scaled well below the wavelengths of the light that are used for this lithography, the shapes of the mask geometries must be drawn substantially different from the shapes that are to be defined on the fabrication materials due to the need for resolution enhancement techniques (RETs) and optical proximity correction (OPC).

In further detail, as illustrated in FIG. 1, the traditional design flow for an Application-Specific Integrated Circuit (ASIC) that contains both memory cells/blocks and logic gates/blocks is illustrated. The memory bit-cells are carefully designed in silicon one or more times for a specific technology, then compiled into a memory block using software that is referred to as a memory compiler. The printability of the memory cells are controlled for compilation of memory blocks of any size by the design and silicon testing of bit-cells that are surrounded by identical neighboring bit-cells. To ensure proper control of the lithography process, the number of neighborhood cells required for a test-run of silicon is based on the silicon technology, the illumination controls and equipment used for lithography, and the manufacturing processes.

In contrast to the memory block design, referring to the left side of FIG. 1, the traditional design flow for the logic portion of an IC, particularly an ASIC, corresponds to: designing a library of cells in test runs of silicon; characterizing the cells in terms of their layouts and performances; configuring interconnections of cells as part of technology mapping step for logic synthesis; and arranging as part of the physical design step to create a logic block.

In this traditional flow, the lithography is controlled by post-processing of the geometrical patterns that are generated for physical design during the step that we refer to as the manufacturing interface in FIG. 1. It is important to note that the logic gates are designed without regular geometry pattern constraints, and their boundaries with neighboring cells in the final layout are not constrained for printability, and as such the manufacturing interface may not be able to ensure a high yield in terms of properly functioning (both logical operation correctness and performance) integrated circuits.

Test structures are presently used to evaluate the printability of fundamental components, circuit primitives, and/or design rules, however these existing methodologies do not otherwise restrict the allowable geometry patterns from which the IC is constructed.

What is needed is a means of fabricating silicon test structures to define uniform patterns of geometrical shapes that establish the underlying physical regularity from which the electronic devices and associated interconnects may be constructed.

SUMMARY OF THE INVENTION

The invention provides a method and process for designing an integrated circuit based on using the results from both 1) a specific set of silicon test structure characterizations and 2) the decomposition of logic into combinations of simple logic primitives, from which a set of logic bricks are derived that can be assembled for a manufacturable-by-construction design. This implementation of logic is compatible with the lithography settings that are used for implementation of the memory blocks and other components on the integrated circuit, particularly by implementing component features that are geometrically consistent, preferably for a specific lithography setup. The invention provides the ability to recompile a design comprised of logic and memory blocks onto a new geometry fabric to implement a set of technology-specific design changes, without requiring a complete redesign of the entire integrated circuit.

BRIEF DESCRIPTION OF THE DRAWINGS

These and other aspects and features of the present invention will become apparent to those of ordinary skill in the art upon review of the following description of specific embodiments of the invention in conjunction with the accompanying figures, wherein.

DETAILED DESCRIPTION

This invention provides a method and process by which silicon test structures are first fabricated to define uniform patterns of geometrical shapes. These uniform patterns of geometrical shapes are used to define the underlying fabric from which the component features for the electronic devices and associated interconnect structures on the integrated circuit are derived such that they are geometrically consistent, preferably for a specific lithography setup. The invention provides a means whereby these uniform patterns of geometrical shapes (also referred to as regular patterns, or regular geometrical patterns) will be optimized to match the corresponding settings for the illumination controls that will be used for lithography. The invention also provides a novel method and means by which illumination controls are determined by the requirements of the uniform pattern printing, as well as the printing of the geometrical patterns for memory cells and other integrated circuit components that are derived from the uniform patterns. The invention further provides the ability to recompile a design comprised of logic and memory blocks onto a new geometry fabric to implement a set of technology-specific design changes, without requiring a complete redesign of the entire integrated circuit.

One aspect of the invention is that the number of patterns that exist and which are used to establish the underlying physical regularity of the component features is purposefully kept to a small number, such that the number of patterns is typically less than 100-200, and, put another way, for complex designs, will typically be orders of magnitude less in number than using patterns as used with conventional standard cell libraries. And for each of the patterns that exist, there is associated with that pattern the corresponding settings for the illumination controls that will be used for lithography. As such, due to the limited number of patterns within the memory blocks or logic bricks as described hereinafter, the overall number of patterns that will exist and require preprocessing (such as OPC and RET as discussed previously) is substantially smaller, thus causing a significant decrease in the amount of computing power needed for preprocessing, since the amount of computing power needed to properly optimize the shape and size of the illuminator for each different pattern is very significant, reducing the number of patterns for which such optimization is needed is a significant advance. Furthermore, greater attention can be paid to optimizing the OPC and RETs for the reduced number of patterns such that the resulting circuit components are constructed with superior performance in terms of significantly reduced process variations.

Figure 1:
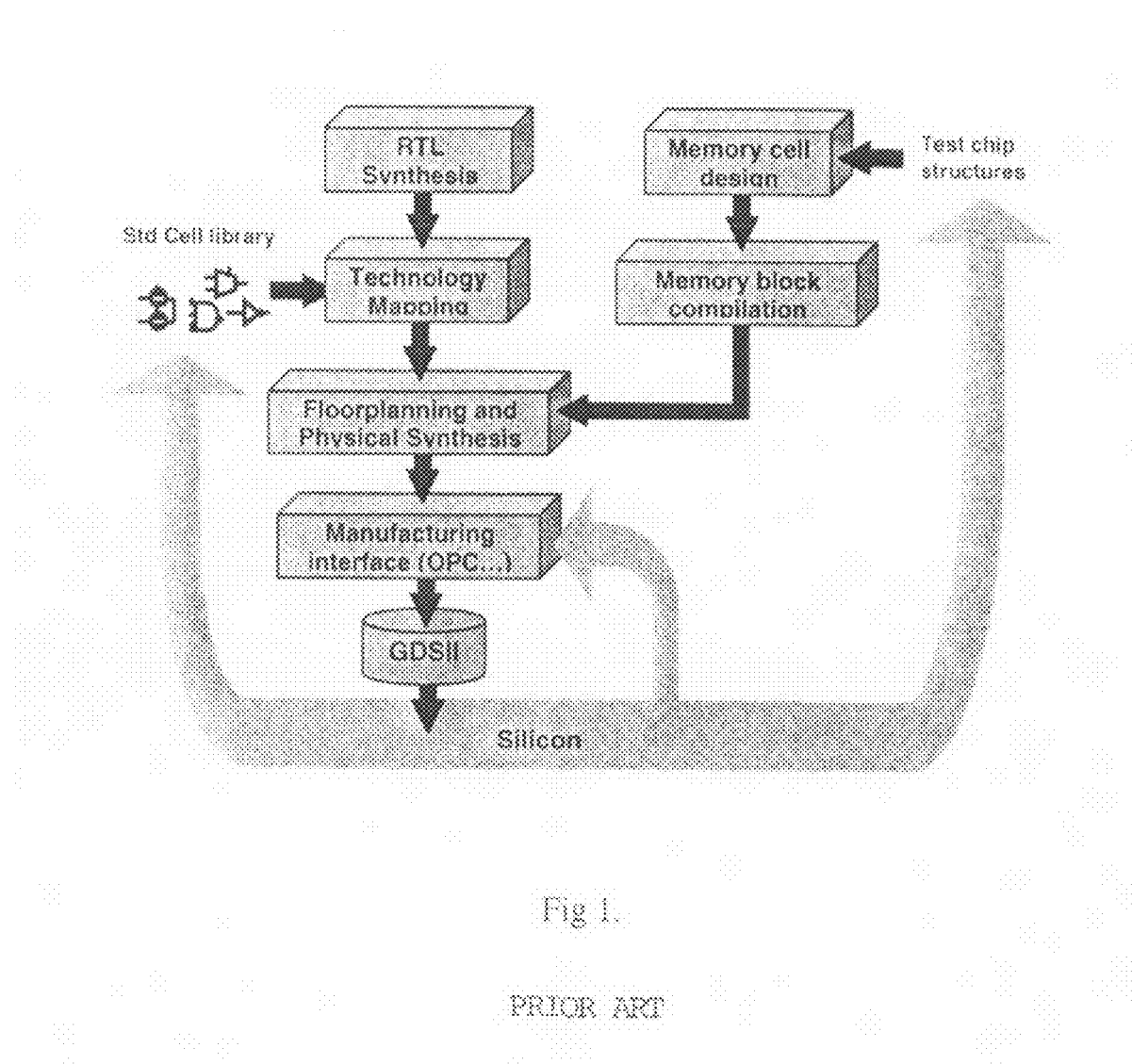
FIG. 1 illustrates a traditional design flow for an integrated circuit.
Figure 2:
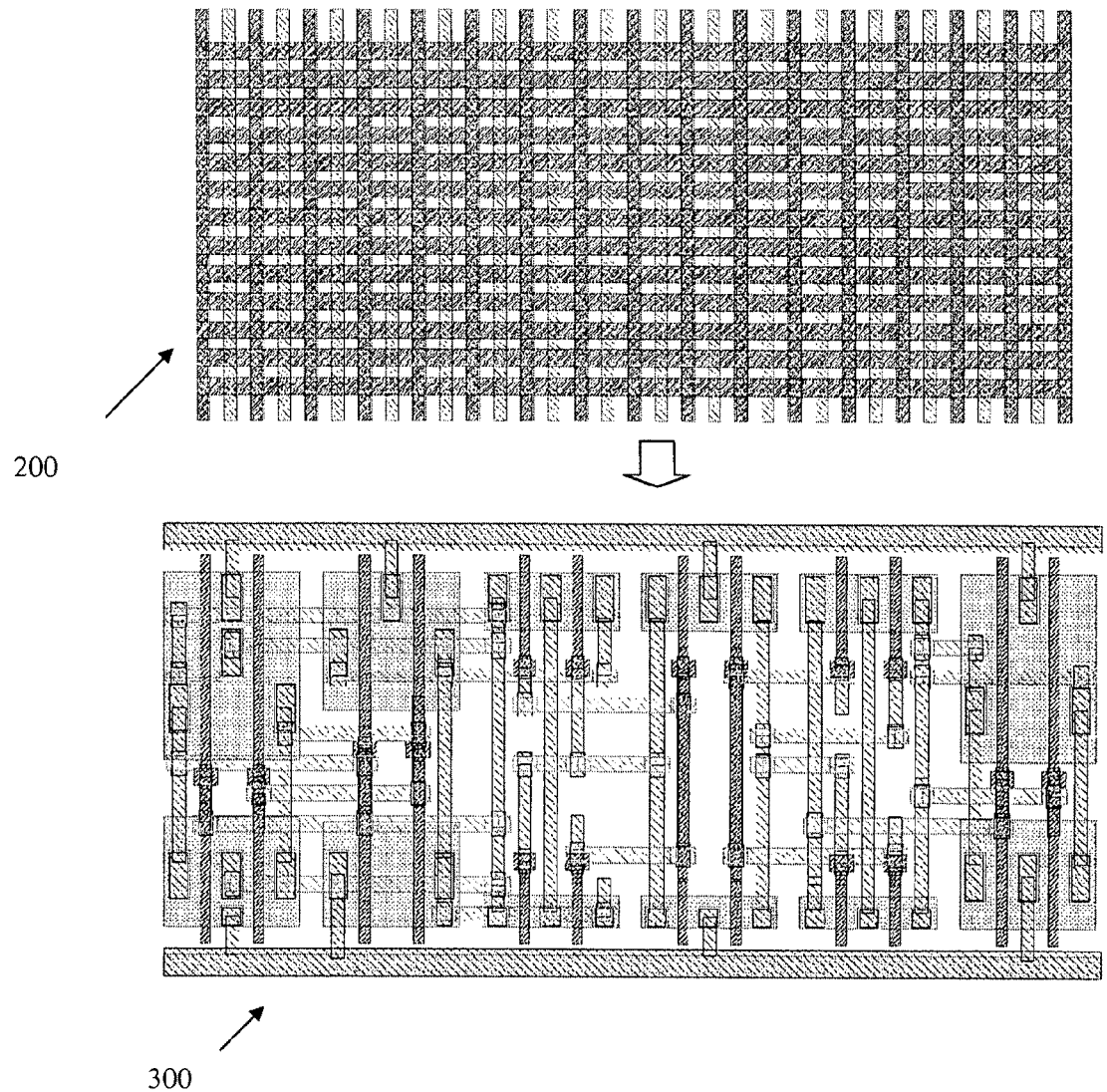
FIG. 2 illustrates an exemplary fabric according to the present invention.

The invention provides that the derived uniform patterns of geometrical shapes are used to specify an underlying fabric of regular geometry. All the geometrical shapes of the component features for all devices and interconnections are ultimately derived from combinations of these patterns. The resulting component features can be viewed in a number of manners, such as, for example, features obtained from removing segments from the fabric to derive a unique pattern on various layers which produces a specific circuit component, or building up such a component feature. In a preferred embodiment, the resulting geometrical shapes for a particular mask layer that correspond to the component features are derived by a process that is equivalent to removing selected segments from the fabric that is based on the patterns and adding "vias" in restricted locations to connect neighboring layers, as is illustrated in FIG. 2, with the fabric 200 containing different layers, with each layer thereby having geometrically consistent component features therein. All of the geometric shapes on a layer are at a fixed pitch, and have a fixed width for the horizontal and vertical directions respectively. Therefore the fabric can be represented by a fully connected graph, or grid. Geometrically consistent component features are achieved since they are optimized to match the corresponding settings for the illumination controls that will be used for lithography. In a particular aspect, similarities between regular geometric patterns can have associated therewith similarities in the settings for illumination controls. It is noted that the layers that are above the substrate layer are typically referred to, and are herein referred to, as being the fabric, with the doped substrate layer not being considered part of the fabric. In one preferred embodiment, the removal of certain fabric portions using patterns and via connections between layers thereby create a brick 300 with devices and interconnections that implement predetermined functions, while implicitly satisfying the requirements for printability using the aforementioned illumination settings, though other manners of creating a series of uniform bricks can also be implemented. With this preferred embodiment, the fabric itself is not viewed as having unique patterns, since it is uniform, and loosely associated with the design rules. The bricks, however, can be defined by a set of unique patterns, as formed by removing segments of the fabric.

As one example of this invention, a portion of a digital integrated circuit is formed by mapping a restricted set of logic primitives (e.g. nand, nor, invert and multiplex) onto areas of regular geometric fabrics, thereby forming the patterns on the layer that result in the component features for devices and interconnections that will be perform the intended logic functions, with different combinations of logic functions being used to instantiate different logic bricks. In such cases, the logic primitives are represented by subset patterns which are based on the underlying uniform patterns which define the fabric. The physical instantiations of the different logic function combinations in silicon are referred to as logic bricks, and the concept of logic bricks is known. The logic bricks according to the present invention, however, further distinguish from logic bricks as has been known in that they are formed using common geometric patterns that have been chosen for printability and which thus result in the consistent component features of the devices and interconnections of a particular brick. As such, the brick sizes and patterns used within the bricks are optimized for compatibility with the illumination control settings that will be used for the lithography of the bricks, as well as the lithography of the other IC components, such as memory cells. As such, different logic bricks will contain different combinations of logic functions, implemented by different devices, but the physical patterns that make up the devices and interconnections in different logic bricks are consistent with the underlying uniform fabric, and therefore consistent the illumination setup.

Figure 3:
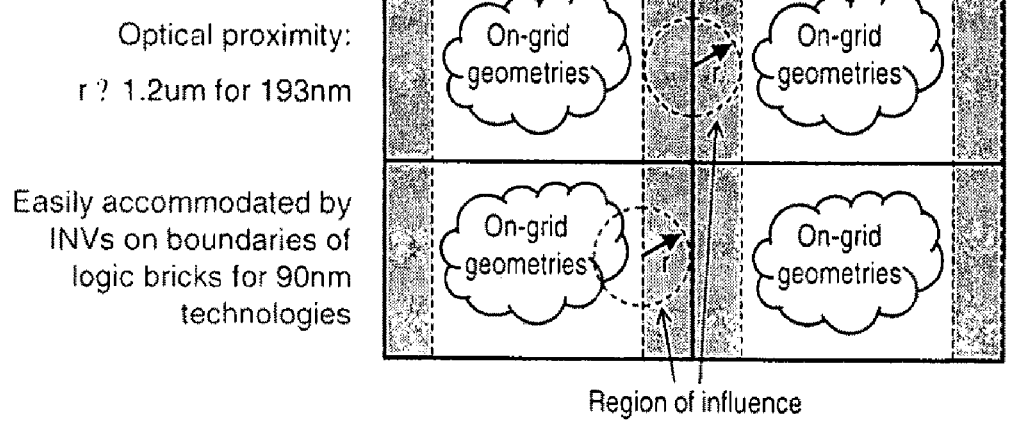
FIG. 3 illustrates the usage of controlled boundaries of logic functions so that common geometrical patterns appear among neighboring logic bricks according to the present invention.

Also, the physical boundaries of the logic bricks are controlled so that common geometrical patterns appear among neighboring logic bricks that are printed, as is illustrated in FIG. 3. This is significant, since in the implementation of a typical integrated circuit, some small number of different logic bricks will be combined in order to produce the functionality needed. So, for example, in a particular integrated circuit design, there may be ten different logic bricks that are used, with each of the 10 logic bricks used some integer number of times, and, preferably, all of the different logic bricks being formed from the same fabric (and thereby resulting in a minimal number of additional unique patterns within different bricks to begin with). In addition, given that the at the physical boundary of each brick there are common geometrical patterns corresponding to component features, this even further reduces the overall number of unique patterns that will require optimizations such as OPC that are computationally large in terms of overall computer power needed, as mentioned above. Accordingly, in addition to having unique patterns within different bricks that are based upon regular patterns of the fabric, the existence of common geometrical patterns at the physical boundary of each brick further reduces the preprocessing computations that are necessary.

This invention also provides that once the physical design of a brick has been established based on the illumination controls, it can be evaluated for printability in silicon independently of the other bricks that will ultimately be printed in its neighborhood. Such evaluation is not needed in many instances, since the various bricks in a design preferably come from a common fabric. Nonetheless, typically the first time a brick is implemented it will be evaluated, and, subsequently, when modifications that are more than small changes to certain settings, as described hereinafter, are made, it can be prudent to perform another evaluation This method and process invention for logic design and implementation is therefore analogous to the process of memory block design, and in stark contrast to the process by which application-specific integrated circuits (ASICs) are built using standard cells.

Figure 4:
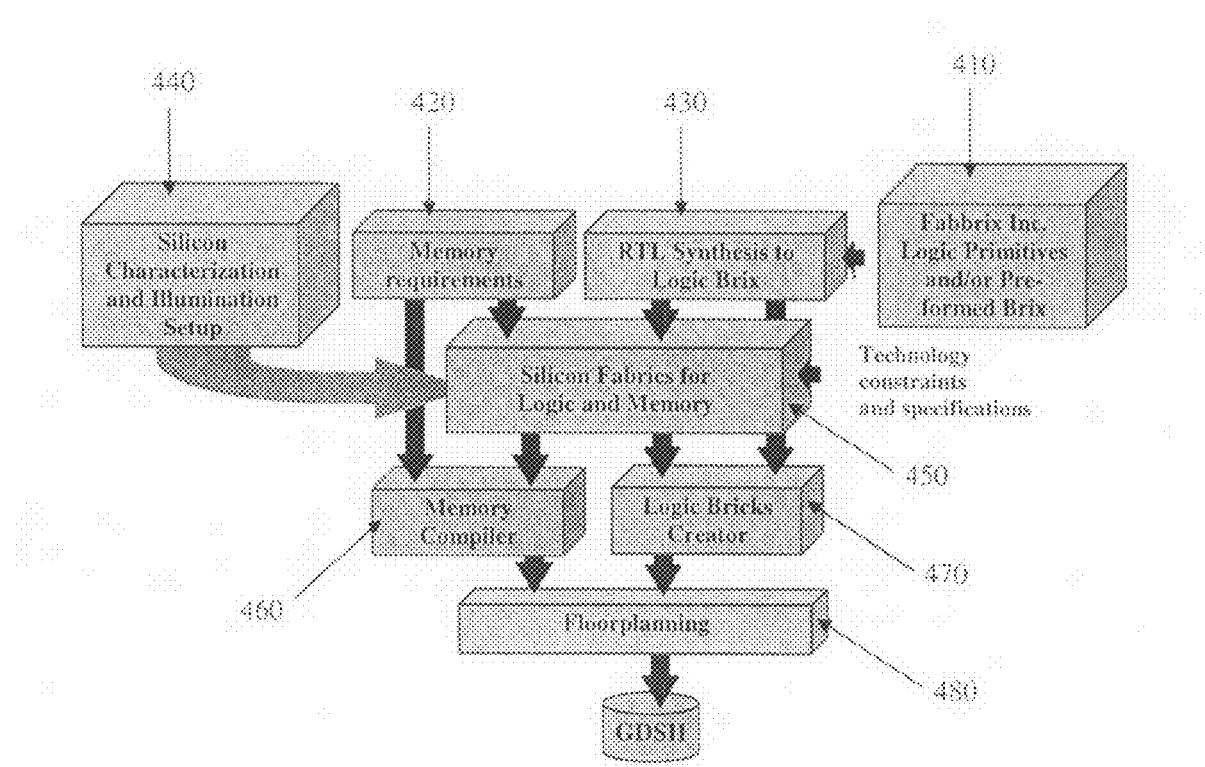
FIG. 4 illustrates the design flow according to the present invention for designing an integrated circuit using regular geometry patterns according to the present invention.

The method and process for designing integrated circuits by the invention described herein is summarized in FIG. 4. In this method and process, the silicon characterization is performed for a compatible set of illumination controls that will define the geometry shapes for the memory bit-cells and for the regular geometry patterns for the logic circuits that are used to operate upon the fabric. The invention provides concurrent design of the regular geometric patterns that are used to form the component features for the memory and the logic, a critical innovative step useful in producing high yield for integrated circuits that are designed in extreme scaled CMOS.

The memory bit-cells are designed in a manner similar to the traditional flow, but they now additionally considers the geometry pattern requirements (and therefore the illumination control settings). An example of such a requirement would be the determination of the regular fabric required for control of process variations that impact effective channel length for the transistors that define the logic, which could in turn define the leakage currents for the devices, with the channel length being a component feature in this example. This method of design allows the application-specific technology targets to become part of the system level design process, as shown in FIG. 4.

Following the methodology described in FIG. 4, described in detail hereinafter, an aspect of this invention is that the design of a block of logic gates can now be created analogously to the construction of a memory block. Once the fabric is derived for a particular technology with technology-specific settings (e.g. effective channel length), just as is done for a specific bit-cell for memory, the logic primitives are mapped to shapes that are consistent with or derived from the regular fabric patterns. In this invention, the physical patterns that comprise a small logic function are represented by logic bricks. Note that bricks can be of various sizes, and while somewhat analogous to "cells" used for standard cell design, bricks are very distinct in terms of their geometrical regularity.

For memory block design, individual bit-cells are fabricated in test runs of silicon with neighboring bit-cells to mimic their environment on an IC. For standard cells, it is impractical to construct test chips that mimic all possible environments for all cells in a standard cell library. The invention provides that once the regular geometry patterns that are used to form the component features are derived from the silicon test structures, the regular geometry patterns that are used to form the component features for the bricks and their environment are sufficiently understood so that lithography can be controlled in a manner analogous to that which is possible for memory compilation.

Referring to FIG. 4, the silicon test structures and the technology-specific design requirements are used to derive the regular geometry patterns that are used to form the component features for both the logic components and the memory components in a manner in which they are geometrically consistent with each other as shown in the functional step 450 labeled "Silicon Fabrics for Logic and Memory". These regular geometry patterns that are used to form the component features for both the logic components and the memory components are obtained using information on the technology constraints and specifications, as well as from the silicon characterization and illumination controls input step 440. From these regular geometry patterns that are used to form the component features, the logic bricks are compiled in step 470 from a combination of the fabric constraints and the logic primitives or preformed brick component features that are obtained as shown at step 410 and synthesized as shown at step 430. Similarly, the memory block (or blocks in the case of two or more different types of memories on the same IC being used) is compiled in step 460, using regular geometry patterns that are used to form the component features from the silicon fabrics for logic and memory step 450, as well as information obtained from the memory requirements input step 420. Thereafter, the traditional floor planning of the memory blocks and regular logic fabric blocks step 480 can occur, so that the results can be stored for subsequent use.

Note that the bricks can be unique for each logic function required as determined from synthesis, as long as the physical creation of each brick is done so while maintaining the required geometrical regularity. Bricks can also be derived from the design specifications (as described by the design netlist) of one or more applications whereby each set of regular geometry patterns which form bricks can be slightly modified to "configure" the bricks for a specific logic function. One example of such configuration could be the insertion of vias to connect neighboring layers of metal to form a connection, thereby configuring the logic to perform a specific function.

A feature of this invention is that, unlike standard cells, for which cells are designed and tested in silicon for specific technology settings (e.g. effective channel lengths), the logic representations for bricks can be mapped to new regular fabrics to implement new technology settings without requiring the explicit characterization of the bricks in silicon. This is a powerful capability for allowing technology-specific adjustments to be made to a design. For example, a lower leakage design can be derived for a specific bricks design whereby the incurred area and performance can be estimated prior to fabrication based on the physical changes in the bricks.

Another implementation of the invention uses an already existing memory bit-cell block, which block already has established its lithography settings and optimizations. The lithography settings and optimizations, along with the regular geometric patterns that result in the geometrically consistent memory cell features that exist in the memory bit-cell block, can be used for the regular geometric patterns are used to obtain the geometrically consistent features within the logic bricks.

In an implementation that is a bit different than that described above, for an already existing memory bit-cell block, which block already has established its lithography settings and optimizations, the lithography settings and optimizations, preferably along with the regular geometric patterns that result in the geometrically consistent memory cell features that exist in the memory bit-cell block, can be used to derive a geometrically consistent fabric for the logic, from which the compatible logic bricks can be constructed.

As another example of application specific process optimization, since the logic brick/memory block design will have only a limited number of patterns that are shared between them, it is easier to optimize process parameters, such as scanner settings used for lithography. Therefore, given a logic brick/memory block design, one can actually explore alternative process settings and be able to easily assess the impact on performance and design quality using the available simulation tools.

One optimization example that will change the component features based upon changing a parameter is changing the pitch of the poly silicon lines (and corresponding process settings) that define the size and locations of the transistors to achieve a different trade-off between OFF (leakage) and ON (which defines transistor speed) currents and design density (area). This allows one to adjust a finalized layout to meet an originally intended power/performance/area objective that is impossible to optimize a priori. Also, as the process evolves for a specific design in a specific technology, new advances in the process can be easily introduced in the design (i.e. design can keep up with advances in the current process). The existing logic brick/memory block design can be adjusted to accommodate those process changes without requiring a redesign.

The present invention enables this adjustment without redesign because more optimal and accurate OPC (optical proximity correction) models can be applied to the limited number of patterns that are present in the design. For example, metal line-ends near thick metals (such as power strips) require modification of the power strip in order to print within an acceptable budget. Conventional OPC, which is not context aware, could not make these kind of corrections. With regular fabrics being used with logic bricks, changing the underlying grid spacings allows correction of the OPC because of a small number of unique patterns, and it is a much more predictable change.

Further, if a given pattern in a particular brick is found not provide good yield, it can be readily be replaced by a more manufacturable pattern with direct assessment of the area cost. For example, in a standard cell design, two metals line-ends at close proximity cannot be easily reproduced if they are in a dense region of metal. Thus, this specific pattern would have to be removed, and replaced with a pattern containing the line-ends in a more isolated region of metal.

For metal layers which connect and define the brix (m1/m2), for a given pitch, the width/space can be modified to obtain the desired yield/performance point. For example, decreasing the width of the lines, which will reduce the parasitic capacitances (to substrate & cross-coupled), will thus obtain better performance, at the expense of being able to fill-in thinner gaps in the dielectric (i.e. yield losses due to an open line). Of course this can be applied in reverse, trading off larger capacitance for less likelihood of an open (a failed manufacturing of a line which results in it being an open circuit and not connected).

And with respect to line-ends, the invention allows modifying the extension of metal over a via/contact at the expense of the spacing b/w metals. This allows a trade off of yield due to metal short defects vs. not enough via coverage.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures. It is intended that the scope of the appended claims include such changes and modifications.

What is claimed is:

1. A method of making an integrated circuit that includes at least one compiled memory block and multiple logic components having features substantially smaller than wavelength (s) of light used in a lithography process during fabrication of the integrated circuit, the method comprising at least the following:
   printing the at least one compiled memory block using lithography settings and optimizations established for bit-cells contained in the compiled memory block;
   forming the logic components using regular geometric patterns derived from a regular fabric that controls process variations that impact effective channel length for transistors that define the logic components, said fabric having been designed from the regular geometric patterns that exist in the memory bit-cells; and,
   printing the logic components using the lithography settings and optimizations established for the bit-cells.

2. A method of making an integrated circuit, as defined in claim 1, wherein all geometric shapes in a layer are printed at a fixed pitch, and have a fixed width for the horizontal and vertical directions.

3. A method of making an integrated circuit, as defined in claim 1, wherein the physical patterns that make up the devices and interconnections in different logic components are consistent with the underlying uniform fabric, and therefore consistent with the illumination setup.

4. A method of making an integrated circuit, as defined in claim 1, further comprising:
   optimizing the uniform patterns of geometrical shapes to match settings for illumination controls that will be used for lithography.

5. A method of making an integrated circuit, as defined in claim 1, wherein all geometrical shapes of the component features for all devices and interconnections are ultimately derived from combinations of patterns specified by the underlying fabric.

6. A method of making an integrated circuit that includes at least one compiled memory block and multiple logic components having features substantially smaller than wavelength (s) of light used in a lithography process during fabrication of the integrated circuit, the method comprising at least the following:
   printing the at least one compiled memory block using component features formed from regular geometric patterns;
   printing logic components using component features formed from regular geometric patterns;
   wherein the regular geometric patterns that are used to form component features for the memory and the logic have been concurrently designed from a regular fabric that controls process variations that impact effective channel length for transistors that define the logic components.

7. A method of making an integrated circuit, as defined in claim 6, wherein printing involves utilizing a set of illumination controls compatible with the regular fabric.

8. A method of making an integrated circuit, as defined in claim 6, wherein all geometrical shapes of the component features for all devices and interconnections are ultimately derived from combinations of patterns specified by the underlying fabric.

9. A method of making an integrated circuit that includes at least one compiled memory block and multiple logic components having features substantially smaller than wavelength(s) of light used in a lithography process during fabrication of the integrated circuit, the method comprising at least the following:

forming the at least one compiled memory block using a set of regular geometric patterns;

forming the logic components using regular geometric patterns derived from a regular fabric that controls process variations that impact effective channel length for transistors that define the logic components, said fabric having been designed from the regular geometric patterns that exist in the memory block; and, printing the memory block and logic components using the lithography settings established for bit-cells in the compiled memory block.

10. A method of making an integrated circuit, as defined in claim 9, wherein all geometric shapes in a layer are printed at a fixed pitch, and have a fixed width for the horizontal and vertical directions.

11. A method of making an integrated circuit, as defined in claim 9, wherein the physical patterns that make up the devices and interconnections in different logic components are consistent with the underlying uniform fabric, and therefore consistent with the illumination setup.

12. A method of making an integrated circuit, as defined in claim 9, further comprising:

optimizing the uniform patterns of geometrical shapes to match settings for illumination controls that will be used for lithography.

13. A method of making an integrated circuit, as defined in claim 9, wherein all geometrical shapes of the component features for all devices and interconnections are ultimately derived from combinations of patterns specified by the underlying fabric.

\* \* \* \* \*